United States Patent
Angelopoulos et al.

(10) Patent No.: US 7,270,931 B2
(45) Date of Patent: Sep. 18, 2007

(54) SILICON-CONTAINING COMPOSITIONS FOR SPIN-ON ARC/HARDMASK MATERIALS

(75) Inventors: Marie Angelopoulos, Cortlandt Manor, NY (US); Wu-Song Huang, Poughkeepsie, NY (US); Arpan P. Mahorowila, Bronxville, NY (US); Wayne Moreau, Wappingers Falls, NY (US); Dirk Pfeiffer, Dobbs Ferry, NY (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 10/679,782

(22) Filed: Oct. 6, 2003

(65) Prior Publication Data

US 2005/0074689 A1    Apr. 7, 2005

(51) Int. Cl.
G03C 1/73      (2006.01)
G03C 1/825    (2006.01)
G03C 1/835    (2006.01)

(52) U.S. Cl. .................... 430/270.1; 430/905; 430/914
(58) Field of Classification Search ...... None
See application file for complete search history.

(56) References Cited

U.S. PATENT DOCUMENTS

| 4,891,303 A | | 1/1990 | Garza et al. ............... 430/312 |
| 5,063,134 A | * | 11/1991 | Horiguchi et al. .......... 430/192 |
| 5,380,621 A | | 1/1995 | Dichiara et al. ......... 430/272.1 |
| 5,554,485 A | | 9/1996 | Dichiara et al. ......... 430/271.1 |
| 5,641,849 A | | 6/1997 | Nishida et al. ............... 528/10 |
| 6,025,117 A | | 2/2000 | Nakano et al. ............. 430/314 |
| 6,087,064 A | | 7/2000 | Lin et al. ................. 430/270.1 |
| 6,114,085 A | | 9/2000 | Padmanaban et al. ... 430/270.1 |
| 6,270,948 B1 | | 8/2001 | Sato et al. .................. 430/314 |
| 6,420,088 B1 | * | 7/2002 | Angelopoulos et al. .. 430/272.1 |
| 6,468,718 B1 | | 10/2002 | Kang et al. .............. 430/281.1 |
| 6,527,966 B1 | | 3/2003 | Shimomura et al. .......... 216/41 |
| 6,767,689 B2 | * | 7/2004 | Pavelchek et al. ........ 430/271.1 |

FOREIGN PATENT DOCUMENTS

| JP | 2001-55512 | * | 2/2001 |
| JP | 2002164347 A | | 2/2002 |
| JP | 2002-107938 | * | 4/2002 |

OTHER PUBLICATIONS

Chem. Abstract 134:179709 (English abstract for JP 2001-55512).*
Machine-assisted English translation of JP 2001-55512, provided by Japan Patent Office.*
Machine-assisted English translation of JP 2002-107938, provided by JPO.*
Y. Matzuura, et al., "Synthesis of Polysilane-Acrylic Copolymers by Photopolymerization and Their Application to Positive Resists for EB Lithography", Journal of Photopolymer Science and Technology, No. 2, 14: 175-180; (2001).

* cited by examiner

Primary Examiner—Sin Lee
(74) Attorney, Agent, or Firm—Scully, Scott, Murphy & Presser, P.C.; Joseph P. Abate, Esq.

(57) ABSTRACT

Antireflective compositions characterized by the presence of an Si-containing polymer having pendant chromophore moieties are useful antireflective coating/hardmask compositions in lithographic processes. These compositions provide outstanding optical, mechanical and etch selectivity properties while being applicable using spin-on application techniques. The compositions are especially useful in lithographic processes used to configure underlying material layers on a substrate, especially metal or semiconductor layers.

9 Claims, 1 Drawing Sheet

SILICON-CONTAINING COMPOSITIONS FOR SPIN-ON ARC/HARDMASK MATERIALS

FIELD OF THE INVENTION

The present invention relates to photolithography, and more particularly to antireflective coating (ARC)/hardmask compositions. The ARC/hardmask compositions of the present invention include at least a silicon-containing polymer having pendant chromophore moieties. The present invention also relates to a lithographic process in which the ARC/hardmask compositions are employed as well as lithographic structures that include the same.

BACKGROUND OF THE INVENTION

In the microelectronics industry as well as in other industries involving construction of microscopic structures (e.g., micromachines, magnetoresistive heads, etc.), there is a continued desire to reduce the size of structural features. For example, in the microelectronics industry, the desire is to reduce the size of microelectronic devices and/or to provide greater amount of circuitry for a given chip size.

Effective lithographic techniques are essential for achieving reduction of feature sizes. Lithography impacts the manufacture of microscopic structures, not only in terms of directly imaging patterns on the desired substrate, but also in terms of making masks typically used in such imaging. Typical lithographic processes involve formation of a patterned resist layer by patternwise exposing a radiation-sensitive resist to an imaging radiation. The image is subsequently developed by contacting the exposed resist layer with a material (typically an aqueous alkaline developer) to selectively remove portions of the resist layer to reveal the desired pattern. The pattern is subsequently transferred to an underlying material by etching the material in openings of the patterned resist layer. After the transfer is complete, the remaining resist layer is removed.

For some lithographic imaging processes, the resist used does not provide sufficient resistance to subsequent etching steps to enable effective transfer of the desired pattern to a layer underlying the resist. In many instances (e.g., where an ultrathin resist layer is desired, where the underlying material to be etched is thick, where a substantial etching depth is required, and/or where it is desired to use certain etchants for a given underlying material), a so-called hardmask layer is used intermediate between the resist layer and the underlying material to be patterned by transfer from the patterned resist. The hardmask layer receives the pattern from the patterned resist layer and should be able to withstand the etching processes needed to transfer the pattern to the underlying material.

Also, where the underlying material layer is excessively reflective of the imaging radiation used to pattern the resist layer, a thin antireflective coating is typically applied between the underlying layer and the resist layer. In some instances, the antireflection and hardmask functions may be served by the same material.

Furthermore, device fabrication has migrated to 90 nm node and smaller for next generation chips. The resist thickness has to be thinner than 300 nm due to image collapsing problems, low focus latitude from high NA tool, and high OD of resist formulation in 193 and 157 nm lithography. Conventional thin resist films are not sufficient for etching processes. Therefore, there is a need to address this etch issue by adopting a bilayer silicon resist or a silicon ARC/hardmask approach. The spin-on hardmask provides a better solution than a CVD hardmask, due to the capability of planarization on top of different topography and ease of stripping. It is advantageous to use a ARC/hardmask system because the same single layer resist can be used, without the need of developing a new resist system containing silicon. Thinner resists can also be used in this ARC/hardmask approach to enhance the process latitudes observed in a typical silicon resist type bilayer approach.

While many hardmask and antireflective coating materials exist in the prior art, there is a continued desire for improved compositions. Many of the prior art materials are difficult to apply to the substrate, e.g., they may require the use of chemical or physical vapor deposition, and/or a high temperature baking process may be used in forming the same. It would be desirable to have antireflective coating/hardmask compositions that could be applied by spin-on coating techniques, without need for a high temperature bake.

Additionally, it is desirable to have hardmask compositions which can be easily etched selective to the overlying photoresist while being resistant to the etch process needed to pattern the underlying layer.

U.S. Pat. No. 6,420,088 and co-pending and co-assigned U.S. application Ser. No. 10/124,087, filed Apr. 16, 2002, the disclosures of which are incorporated herein by reference in their entirety, describe a polymer system containing Si—O components in silsesquioxane polymers. The Si—O polymer has etch characteristics similar to silicon dioxide.

Despite the description of Si—O polymers, there is a need for providing new and improved polymer compositions that can be used in photolithography which have etch characteristics that are similar to Si.

SUMMARY OF THE INVENTION

The present invention relates to antireflective coating/hardmask compositions which are useful in lithographic processes. The inventive compositions provide outstanding optical, mechanical and etch selectivity properties while being applicable using spin-on application techniques. The antireflective compositions of the present invention are characterized by the presence of a Si-containing polymer having a plurality of reactive sites distributed along the polymer for reaction with a crosslinking component, and chromophore moieties. The present invention also encompasses lithographic structures containing the antireflective coating/hardmask composition of the present invention, methods of making such lithographic structures and methods of using such lithographic structures to pattern underlying material layers on a substrate.

An embodiment of the present invention is a Si-containing polymer comprising $Si(Si)_n$ moieties in the polymer structure, wherein n is an interger of 1-15, wherein $Si—(Si)_n$ moieties represent linear, branched or cyclic silanes, or any combination thereof.

Specifically, the $Si(Si)_n$ moieties are either in the main chain or in the side group attached to the main chain. More specifically, the $Si—(Si)_n$ moieties in the side group comprise moieties of formula I, II or III.

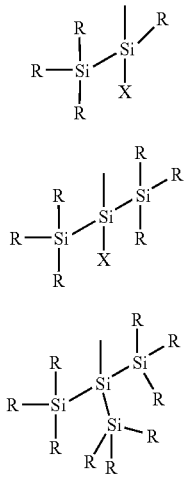

Formula I

Formula II

Formula III wherein, R is each independently selected from an organic moiety, a halogen or a silane, and X is each independently selected from an organic moiety or a halogen. The organic moiety in the above formulas is a substituted or unsubstituted hydrocarbon comprising linear or branched alkyl, aryl, halogenated linear or branched alkyl, halogenated aryl, cyclic alkyl, and halogenated cyclic alkyl, and any combination thereof.

DETAILED DESCRIPTION OF THE INVENTION

Figure 1:
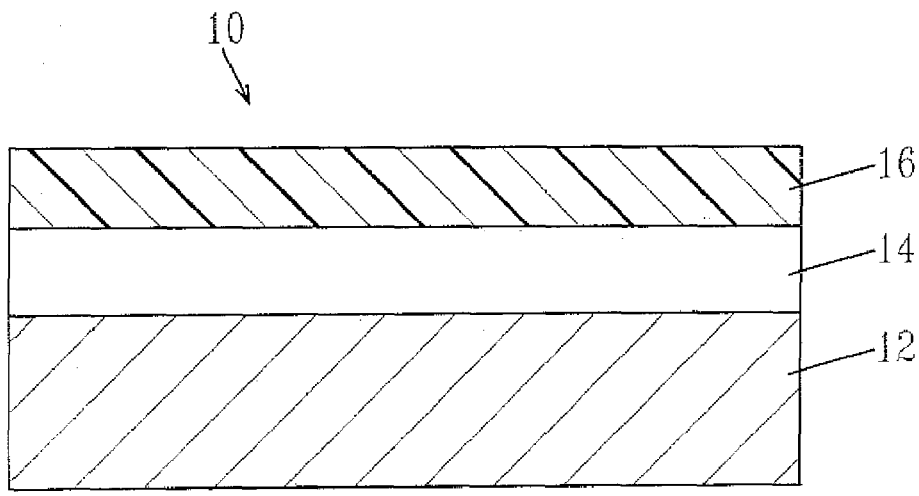
FIG. 1 is a pictorial representation (through a cross sectional view) illustrating a simple trilayer structure of the present invention.

The present invention provides novel antireflective coating/hardmask compositions that are useful in lithographic processes. The antireflective/hardmask compositions of the present invention are characterized by the presence of a Si-containing polymer having chromophore moieties. Lithographic structures containing the antireflective coating/hardmask composition of the present invention, as well as methods of making such lithographic structures and methods of using such lithographic structures to pattern underlying material layers on a substrate are as described herein.

A spin-on ARC/hardmask for etching silicon oxide is needed to compliment spin-on ARCs for etching polysilicon. One embodiment of the invention provides such a spin-on ARC/hardmask containing a high Si—Si (disilane) content. Specifically, the spin-on ARC/hardmask composition of the present invention having the high Si—Si content comprises a Si-containing polymer comprising Si(Si)$_n$ moieties defined as above. More specifically, the Si(Si)$_n$ moieties in the side chain groups can be represented with structural Formula I-III wherein the variables R and X are defined above. In addition to the high Si—Si content, the ARC/hardmasks of the present invention possess properties of regular photoresist resins.

In one embodiment, a process is provided that comprises providing an antireflective/hardmask that includes at least a polymer containing Si—(Si)$_n$ moieties, wherein n is an integer of 1-15, said polymer including a plurality of reactive sites distributed along the polymer for reaction with a crosslinking component, and chromophore moieties, and a crosslinking component, forming a radiation-sensitive imaging layer over the antireflective/hardmask layer, patternwise exposing the imaging layer to radiation thereby creating a pattern of radiation-exposed regions in the imaging layer, selectively removing portions of the imaging layer, the antireflective layer and the underlayer to expose portions of the material layer, and etching, electroplating, metal depositing or ion implanting the exposed portions of the material layer, thereby forming the patterned material feature.

The present invention also provides polymers that comprise a novolacsilane system. The novolacsilane system includes phenolic groups on the main chain and cluster silanes on the side chains. This type of polymeric novolacsilane system is advantageous since it is easy to cast the film from a regular resist solvent (PGMEA) unlike polysilane systems, which are only soluble in aromatic hydrocarbons.

The present invention also provides a thermoset composition comprising a glycoluril, a thermal acid generator and a novolacsilane, which are used to formulate an ARC/hardmask of the present invention.

In accordance with the present invention, the typical etch resistance towards oxygen plasma of the ARC/hardmask is the amount of silicon content present in the ARC/hardmask. The Si—Si components can significantly increase the silicon content more easily than a polymer structure with one Si dispersed in the polymer structure. The high etch resistance to oxygen is especially good for a trilayer approach. In that process, the underlayer is usually etched through with oxygen as an etchant. High etch resistance makes this interlayer a good masking layer.

The underlayers used in the present invention are as described in the trilayer section, chapter 12-10 of "Semiconductor Lithography, Principles, Practices, and Materials" by Wayne Moreau, Plenum Press, (1988), the description of which is hereby incorporated by reference. The underlayers may include crosslinked polyhydroxystyrene, crosslinked polyacrylate(methycrylate) comprising cyclic alkyl groups, crosslinked polyacrylate(methacrylate) comprising fluorinated alkyl groups or aryl groups or both. FIG. 1 shows an illustration of the trilayer system.

Specifically, the trilayer system 10 comprises substrate 12 for patterning, underlayer 14 and the ARC/hardmask 16 of the present invention. The substrate 12 for patterning includes a semiconductor material, a dielectric material, a magnetic material, a conductive material or any combination thereof, i.e., a stack including a semiconductor material and a dielectric or a dielectric and a conductive material.

Examples of semiconductor materials that can be employed in the present invention include, but are not limited to: Si, SiGe, SiC, SiGeC, Ge, GaAs, InAs, InP, silicon-on-insulators (SOIs), and SiGe-on-insulators (SGOIs). The dielectric materials that can be employed in the present invention include any inorganic or organic dielectric material. The inorganic dielectric materials are typically oxides, nitrides or oxynitrides. Examples of inorganic dielectric materials include, but are not limited to: $SiO_2$, $Al_3O_4$, $TiO_2$, perovskite type oxides, SiN, and SiON. The conductive materials that can be employed in the present invention include, but are not limited to: doped polysilicon, and elemental metals such as Cu, W, Al, Pt, and Pd, alloys of the foregoing elemental metals, and silicides thereof. Examples of magnetic materials include CuFe, CoFe and other like compounds.

In the trilayer approach, the underlayer is first applied to the surface of the substrate using a conventional deposition process such as chemical vapor deposition, spin-on coating, evaporation, plasma-assisted chemical vapor deposition, or physical vapor deposition. The thickness of the underlayer is not critical to the present invention, but typically, the underlayer has a thickness from about 80 to about 8000 nm. Next, the ARC/hardmask of the present invention is applied to the upper surface of the underlayer utilizing a conventional deposition process such as spin-on coating, evaporation, chemical vapor deposition, plasma-assisted chemical vapor deposition, physical vapor deposition and other like deposition processes. This thickness of the ARC/hardmask of the present invention after being applied to the upper surface of the underlayer is typically from about 10 to about 500 nm, with a thickness from about 20 to about 200 nm being more typical.

In order to pattern the trilayer structure, a conventional photoresist (not shown) is applied to the upper surface of the ARC/hardmask 16 and then the photoresist is subjected to conventional lithography which includes the steps of exposing the photoresist to a pattern of radiation, and developing the pattern into the exposed photoresist utilizing a conventional resist developer. Following the lithography step, the pattern is transferred into the trilayer structure by transferring the pattern from the resist to the ARC/hardmask, and continuing the pattern transfer from the ARC/hardmask to the underlayer and then to the substrate.

The first pattern transfer step typically includes the use of a dry etching process such as reactive-ion etching, ion beam etching, plasma etching or laser ablation. Reactive-ion etching is a preferred etching technique for transferring the pattern from the patterned photoresist to the ARC/hardmask.

As stated above, after the first pattern transfer step, the pattern is transferred from the remaining resist and ARC/hardmask to the underlayer and then the substrate utilizing one or more etching steps such as reactive ion etching, ion beam etching, plasma etching or laser ablation. The substrate may also be electroplated, metal deposited or ion implanted to form patterned structure. Preferably, the underlayer is etched by using oxygen as an etchant gas or plasma. Following pattern transfer into the substrate, the ARC/hardmask and underlayer are removed utilizing one or more stripping processes that are capable of removing those layers. The result of this process is a patterned substrate.

In an embodiment of the invention, the ARC/hardmask is a polymer system having optical properties in which the n value of the Si-containing polymer is close to that of the photoresist and the dielectric constant k is greater than 0.2. In such instances, the n is selected from about 1.4 to about 2.0.

In another embodiment of the present invention, the Si moieties are preferably in the backbone portion of the polymer. The Si-containing polymer of the present invention which is present in the ARC/hardmask also preferably contains a plurality of reactive sites distributed along the polymer for reaction with a crosslinking component.

The antireflective/hardmask compositions of the present invention generally include a polymer containing Si moieties and chromophore moieties, a crosslinking component, and an acid generator.

One characteristic feature of the polymer is that it is not soluble in conventional solvents such as PGMEA. Instead, a hydrocarbon such as xylene is used as a solvent. The polymer containing Si moieties may be in the polymer backbone and/or in the pendant groups. In accordance with one embodiment of the present invention, the polymer containing Si moieties is preferably an organosilane. The polymer containing Si moieties should have solution and film-forming characteristics conducive to forming a layer by conventional spin-coating. In addition to the chromophore moieties discussed below, the Si-containing polymer of the present invention also preferably contains a plurality of reactive sites distributed along the polymer for reaction with the crosslinking component.

In another embodiment of the invention, may contain any suitable chromophore which (i) can be grafted onto the Si-containing polymer (ii) has suitable radiation absorption characteristics, and (iii) does not adversely affect the performance of the layer or any overlying photoresist layers. The chromophore moieties include groups having unsaturated carbon-carbon bonds, chrysenes, pyrenes, fluoranthrenes, anthrones, benzophenones, thioxanthones, and anthracenes. Anthracene derivatives, such as those described in U.S. Pat. No. 4,371,605 may also be used; the disclosure of this patent is incorporated herein by reference. A highly preferred chromophore that can be used in the present invention, is 9-anthracene.

In one embodiment, the chromophore moieties present in the Si-containing polymer can be chemically attached to the polymer by acid-catalyzed C-alkylation such as by Friedel-Crafts alkylation. A preferred acid for Friedel-Crafts catalysis is HCl. Preferably, about 15 to about 40% of the functional groups contain chromophore moieties. In some instances, it may be possible to bond the chromophore to the monomer before formation of the Si-containing polymer. The site for attachment of the chromophore is preferably an aromatic group such as a hydroxybenzyl or hydroxymethylbenzyl group.

Alternatively, the chromophore may be attached by reaction with other moieties such as cyclohexanol or other alcohols.

For 193 nm resists as imaging layer, any aryl group can be chosen as chromophore moieties for the ARC/hardmask layer. Preferred chromophore moieties are substituted and unsubstituted phenyl groups. For 157 nm resists as imaging layer, any aryl and alkyl groups can be chosen as chromophore moieties. Preferred chromophore moieties are substituted and unsubstituted phenyl groups and substituted and unsubstituted cyclic alkyls. To tune the n and k value for optimum reflectivity control, some transparent components have to be selectively incorporated to the structure of the Si-containing polymer. Such as fluorinated components are needed in the polymer of ARC/hardmask composition for 157 nm lithography.

In yet another embodiment of the invention, the Si-containing polymer comprises a reactive site for reaction with the crosslinking component comprising OH, COOH, amino or imino groups vinyl ether, epoxide groups. Examples of OH groups are linear or branched alkyl alcohols, cyclic alcohols, aryl alcohols, fluorocarbon alcohol and N-hydroxy dicarboxyimide groups. Examples of amino or imino groups are sulfonamide, dicarboxyimide, amine, imine, other amide and other imide groups. Preferred reactive moieties are alcohols, more preferably aromatic alcohols (e.g., hydroxybenzyl, phenol, hydroxymethylbenzyl, etc.) or cycloaliphatic alcohols (e.g., cyclohexanoyl). In yet another embodiment, the Si-containing polymers include block copolymers of silanes with acrylate(methacrylate) comprising reactive sites such as copolymer of silane and acrylic(methacrylic), and silane and styrene comprising reactive sites such as copolymer of silane and hydroxystyrene. These polymers can be made using the literature methods reported in J. Photopolym. Sci. Technol. 2001, 14(2), 175 and U.S. Pat. No. 6,025,117, the disclosures of which are hereby incorporated by reference. The Si-containing polymer embodiments of the present invention preferably have a weight average molecular weight, before reaction with the crosslinking component, of at least about 1000, more preferably a weight average molecular weight of about 1000 to about 100,000.

The crosslinking component is preferably a crosslinker that can be reacted with the Si-containing polymer in a manner, which is catalyzed by generated acid and/or by heating. Generally, the crosslinking component used in the antireflective/hardmask compositions of the invention may be any suitable crosslinking agent known in the negative photoresist art, which is otherwise compatible with the other selected components of the composition. The crosslinking agents preferably act to crosslink the polymer component in the presence of a generated acid. Preferred crosslinking agents are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible crosslinking agents include 2,6-bis(hydroxymethyl)-p-cresol and compounds having the following structures:

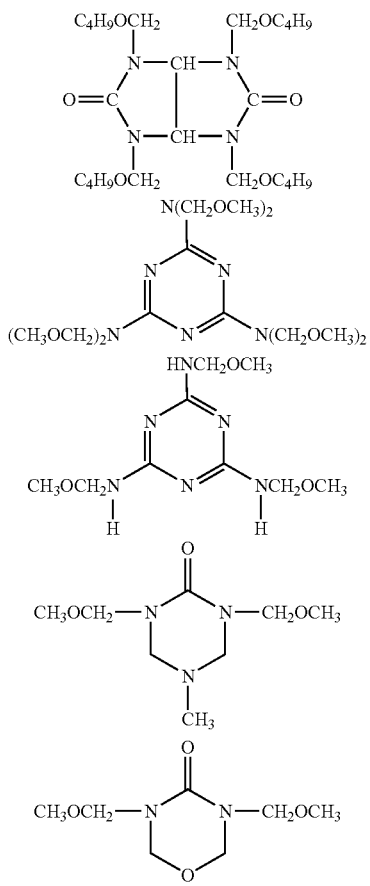

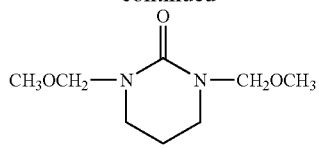

including their analogs and derivatives, such as those found in Japanese Laid-Open Patent Application (Kokai) No. 1-293339, the description of which is hereby incorporated by reference, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547, the disclosure of which is hereby incorporated by reference. Other crosslinking agents such as bis-epoxies of bis-phenols (e.g., bisphenol-A) may also be used. Combinations of crosslinking agents may be used.

The antireflective/hardmask compositions of the present invention preferably contain (on a solids basis) (i) about 50 to about 98 wt. % of the Si-containing polymer, more preferably about 70 to about 80 wt. % of the Si-containing polymer, (ii) about 1 to about 50 wt. % of crosslinking component, more preferably about 3 to about 25% of the crosslinking component, most preferably about 5 to about 25 wt. % of the crosslinking component, and (iii) about 1 to about 20 wt. % acid generator, more preferably about 1-to about 15 wt. % of acid generator.

Figure 2:
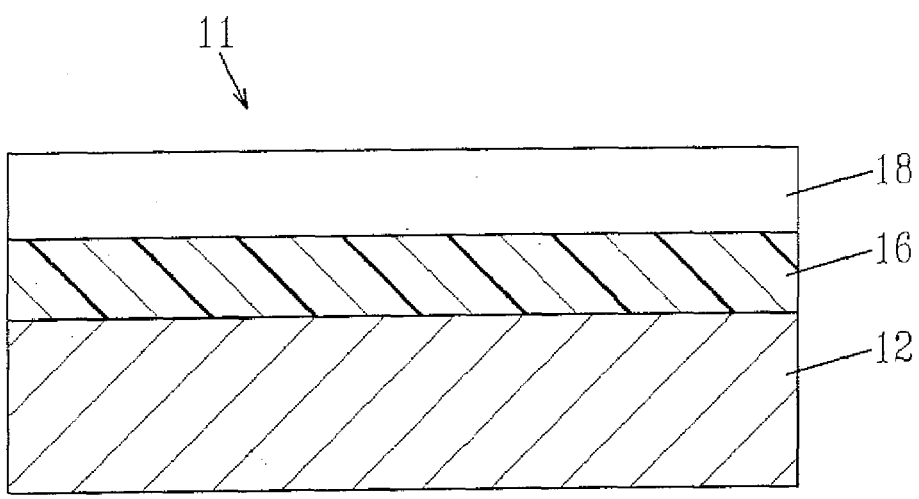
FIG. 2 is a pictorial representation (through a cross sectional view) of a lithographic structure of the present invention.

The antireflective coating/hardmask compositions of the invention may be used in combination with any desired resist material in forming a lithographic structure. Such a lithographic structure is shown, for example, in FIG. 2. Specifically, the lithographic structure 11 of FIG. 2 comprises a substrate 12 for patterning, the ARC/hardmask 16 of the present invention and a resist 18. The substrate for patterning includes any of the substrates mentioned above. The resist 18 is preferably imageable with ultraviolet radiation (e.g., <400 nm wavelength), e.g. 365, 248, 193, 157 nm, EUV, X-ray or with electron beam radiation. Examples of suitable resist materials are described, for example, in U.S. Pat. Nos. 5,861,231; 5,962,184; and 6,037,097, the disclosures of which are incorporated herein by reference. Patterning is achieved utilizing the above described lithographic and etching steps.

The antireflective compositions of the present invention will typically contain a solvent prior to their application to the desired substrate. The solvent may be any solvent conventionally used with resists which otherwise does not have any excessively adverse impact on the performance of the antireflective composition. Preferred solvents are propylene glycol monomethyl ether acetate, cyclohexanone, and ethyl cello solve acetate. The amount of solvent in the composition for application to a substrate is preferably sufficient to achieve a solid content of about 8 to about 20 wt. %. Higher solid content formulations will generally yield thicker coating layers. The compositions of the invention may further contain minor amounts of auxiliary components (e.g., base additives, etc.) as may be known in the art.

The antireflective composition embodiments of the invention can be prepared by combining the polymer, crosslinking component and acid generator, and any other desired ingredients using conventional methods. The compositions of the invention advantageously may be formed into antireflective/ hardmask layers on a substrate by spin-on coating followed by baking to achieve crosslinking and solvent removal. The baking is preferably conducted at about 280° C. or less, more preferably about 90° C. to about 250° C., most preferably about 170° C. to about 230° C. The baking time may vary depending on the layer thickness and bake temperature. A typical time at 215° C. would be about one minute. The thickness of the antireflective composition of the invention may be varied depending on the desired function. For example, where the composition is used as a non-planarizing antireflective coating, the thickness may be about 50 to about 500 nm. When the composition is used as a planarizing hardmask, the thickness is preferably about 0.5 to about 5.0 μm. If desired, the compositions of the invention may also be used as dielectric materials in a similar manner to conventional spin-on glass materials.

In yet another embodiment, the acid generator is preferably an acid generator compound that liberates acid upon thermal treatment. A variety of known thermal acid generators are suitably employed such as, e.g., 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the resist art may also be used as long as they are compatible with the other components of the antireflective composition. When a radiation-sensitive acid generator is used, the cure (crosslinking) temperature of the composition may be reduced by application of appropriate radiation to induce acid generation which in turn catalyzes the crosslinking reaction. Even if a radiation-sensitive acid generator is used, it is preferred to thermally treat the composition to accelerate the crosslinking process (e.g., for wafers in a production line).

In another aspect of the invention, a process for applying a pattern to a substrate used in fabricating an integrated circuit, comprises the steps of: depositing an organic underlayer on a surface of a substrate; depositing a second layer containing at least a partially silicon-based polymer of the present invention on the organic underlayer; depositing an organic photoresist resolution layer on the second layer; projecting a pattern image onto the resolution layer with a light source to which the resolution layer is sensitive; developing the resolution layer to leave patterned orifices therethrough and to expose patterned areas of the outer surface of the second layer; exposing the resolution layer and the patterned areas of the second layer to light to which the second layer is sensitive but which will be strongly absorbed by the resolution layer; developing the second layer to create orifices therein extending from the patterned areas of the outer surface of the second layer to corresponding patterned areas on the outer surface of the organic underlayer; and differentially etching exposed portions of the organic underlayer much faster than the second layer until the surface of the substrate is reached.

In another aspect, the present invention encompasses a method of forming a patterned material feature on a substrate, the method comprises: providing a material layer on a substrate, forming an organic underlayer over the material layer, forming an antireflective/hardmask layer of the present invention over the organic underlayer, forming a radiation-sensitive imaging layer over the antireflective layer, patternwise exposing the imaging layer to radiation thereby creating a pattern of radiation-exposed regions in the imaging layer, selectively removing portions of the imaging layer, the antireflective/hardmask layer and the organic underlayer to expose portions of the material layer, and etching, electroplating, metal depositing or ion implanting the exposed portions of the material layer, thereby forming the patterned material feature.

An embodiment of the invention also encompasses methods of making lithographic structures. The embodiment also includes a deposition process wherein various layers are formed atop each other.

Another embodiment of the present invention relates to a method of making of a novolac polymer combining a silane-substituted phenol with formalin. In this embodiment, p-, o- or m-actoxystyrene styrene is hydrosilated with tris (trimethylsilyl)silane, methylbis(trimethylsilyl)silane or pentamethyldisilane, then the hydrosilated product is hydrolyzed with $NH_4OH$ to form a silane substituted phenol. The silane phenol is then condensed with formaldehyde to form a novolacsilane. One example of the novolacsilane structure is shown below:

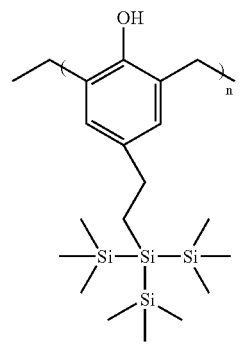

One embodiment of the invention involves the use of the ARC/hardmask compositions for lithographic processes using mid-UV, 190-300 nm deep UV, 125-160 nm vacuum UV, EUV, X-ray, or e-beam or other imaging radiation.

In another embodiment, semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. The composition of the invention is preferably applied directly over the material layer to be patterned, preferably by spin-coating. The composition is then baked to remove solvent and cure (crosslink) the composition. A radiation-sensitive resist layer can then be applied (directly or indirectly) over the cured antireflective composition of the invention.

In one embodiment of the invention, the solvent-containing resist composition is applied using spin-on coating or other techniques. The substrate with the resist coating is then preferably heated (pre-exposure baked) to remove the solvent and improve the coherence of the resist layer. The thickness of the applied layer is preferably as thin as possible with the proviso that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to about 15 minutes, more preferably about 15 seconds to about one minute. The pre-exposure bake temperature may vary depending on the glass transition temperature of the photoresist.

After solvent removal, the resist layer is then patternwise-exposed to the desired radiation (e.g., 248 nm ultraviolet radiation). When scanning particle beams such as electron beams are used, patternwise exposure may be achieved by scanning the beam across the substrate and selectively applying the beam in the desired pattern. More typically, when wavelike radiation forms such as 248 nm ultraviolet radiation, the patternwise exposure is conducted through a mask which is placed over the resist layer. For 248 nm UV radiation, the total exposure energy is preferably about 100 millijoules/cm$^2$ or less, more preferably about 60 millijoules/cm$^2$ or less (e.g., 7-35 millijoules/cm$^2$). The desired dose range may vary slightly with different exposure wavelengths such as in 193 and 157 nm.

After the desired patternwise exposure, the resist layer is typically baked to further complete the acid-catalyzed reaction and to enhance the contrast of the exposed pattern. The post-exposure bake is preferably conducted at about 60° C. to about 175° C., more preferably about 90° C. to about 160° C. The post-exposure bake is preferably conducted for about 30 seconds to about 5 minutes.

After post-exposure bake, the resist structure with the desired pattern is obtained by contacting the resist layer with an alkaline solution, which selectively dissolves the areas of the resist which were exposed to radiation. Preferred alkaline solutions (developers) are aqueous solutions of tetramethyl ammonium hydroxide. The resulting lithographic structure on the substrate is then typically dried to remove any remaining developer solvent.

The pattern from the resist structure may then be transferred to the exposed portions of the layer of antireflective material of the invention by etching with $CF_4$, $Cl_2$ or other suitable etchant using techniques known in the art.

After the opening of the layer of antireflective material of the invention and any underlying antireflective coating, the underlying material layer to be patterned may then be etched using an etchant appropriate to the material layer composition. When the material layer is a metal (e.g., Cr) a combination of $Cl_2/O_2$ may be used as a dry etchant. Once the desired pattern transfer has taken place, any remaining resist may be removed using conventional stripping techniques. If the composition of the invention is being used strictly as a hardmask or non-planarizing antireflective coating, the composition of the invention may be removed by contacting with a $CF_4/O_2$ plasma.

In one embodiment, the compositions and resulting lithographic structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices. The compositions of the present invention are especially useful in the context of creating patterned metal structures, especially Cr-based structures useful as masks.

Examples of general lithographic processes where the composition of the invention may be useful are disclosed in U.S. Pat. Nos. 4,855,017; 5,362,663; 5,429,710; 5,562,801; 5,618,751; 5,744,376; 5,801,094; 5,821,469 and 5,948,570, the disclosures of which are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

The following examples are given to illustrate some ARC/hardmask compositions of the present invention.

All the starting materials in the following examples were purchased from Aldrich Chemical Company.

EXAMPLE 1

Synthesis of 4-Hydroxy-1-[2-tris(trimethylsilyl) silylethyl]benzene

Step 1

4-Acetoxystyrene (16.0 grams, 0.10 mole), tris(trimethylsilyl)silane (25.0 grams, 0.10 mole), and 100 ml heptane were placed in a round bottom flask equipped with a water condenser and nitrogen inlet. Platinum(0)-1,3-divinyl-1,1,3,3-tetramethyldisiloxane complex in xylene (1 ml) was added to this solution and heated to reflux for 18 hours. Afterwards, solvents were distilled off at atmospheric pressure and the residue was fractionally distilled under reduced pressure 4-acetoxy-1-[2-tris(trimethylsilyl)silylethyl]benzene (11.0 grams) was collected between 190-215° C. at 5 mm pressure as a clear liquid.

Step 2

To the product from Step 1 was added methanol (50 ml) and ammonium hydroxide (30% solution in water, 2.8 ml, 0.05 mole), and the mixture was heated to mild reflux for 2 hours. Most of the solvent was removed in a rotary evaporator and the residue was dissolved in 50 ml ether. This ether solution was washed with 2×100 ml 5% hydrochloric acid solution followed by 100 ml brine. The solution was then dried over anhydrous magnesium sulfate. Afterwards, the solvent was removed in a rotary evaporator and dried under vacuum to give 8 grams of 4-Hydroxy-1-[2-tris(trimethylsilyl)silylethyl]benzene as a waxy solid.

EXAMPLE 2

Synthesis of the Novolacsilane Polymer

The novolacsilane polymer was synthesized according to the following procedure. An amount of 5.05 g of 4-Hydroxy-1-[2-tris(trimethylsilyl)silylethyl]benzene synthesized in Example 1 was mixed with 1.28 g of 37.17% formalin and 7.5 g of methoxypropanol in a flask equipped with a mechanical stirrer and a reflux condenser. Oxalic acid dihydrate (46 mg) was added to the reaction mixture at 95° C. while stirring. After 18 hours of stirring, the temperature raised to 120° C. and the reaction mixture was heated at 120° C. for 3.5 hours with argon blow through the system. The bath temperature was then gradually raised to 145° C. with vacuum pumping to remove solvent, unreacted formalin and water. The resulting novolacsilane polymer had a weight-average molecular weight of 2,560 as measured by gel permeation chromatography (GPC) with a polystyrene standard.

EXAMPLE 3

Formulation and Optical Properties

The novolacsilane polymer synthesized in Example 2 was dissolved in propylene glycol monomethyl ether acetate (PGMEA) in concentrations of 100 parts by weight. A crosslinking agent tetramethoxymethyl glycoluril, available from DayChem, in a concentration of 8 parts by weight and di(t-butylphenyl)iodoniumperfluorobutylsulfonate (DtBPI-PFBuS) in a concentration of 4 parts by weight were added to the solution, achieving 10 wt. % of total solids. The formulated solution was spin-coated on silicon wafer baked on hotplate at 215° C. for 60 s, then n and k values were measured with VB-250 VASE Ellipsometer manufactured by J.A. Woollam Co. Inc. The optical properties of the film for 193 nm radiation are as follows:

| Film Polymer | n | k |
|---|---|---|
| Novolacsilane | 1.71 | 0.34 |

EXAMPLE 4

Etch Study in $Cl_2$ Plasma

The novolacsilane polymer was etched in a $Cl_2$-based plasma on a FEOL etcher. HBr and $Cl_2$-based plasmas are typically used to etch silicon and polysilicon. In the table below, it can be seen that the novolacsilane polymer has a lower etch rate than AR237J, a typical 193 nm resist, indicating that it would be a better hardmask for silicon etching.

| Sample | Thickness (A) Initial | Final | Etch rate (A/min.) |
|---|---|---|---|
| Nov.-Silane | 835 | 244 | 1773 |
| 193 spin-on | 2943 | 2284 | 1977 |
| TERA | 1125 | 134 | 2973 |
| AR237J | 2956 | 2280 | 2028 |

EXAMPLE 5

Etch Study in Oxidizing and Reducing Plasmas

The novolacsilane polymer has about 29 wt. % Si and is expected to have minimal etch rates in oxidizing (e.g., $O_2$ and $SO_2$—$O_2$) and reducing plasma etches (e.g., $N_2$—$H_2$ and $NH_3$). The plasma can be used in conjunction with trilayer patterning schemes where the novolacsilane is used as a mask to pattern an organic underlayer. The results of an etch rate study conducted on three Si-containing materials is shown in the table below.

| Polymer | Si wt. % | Etch Rate (A/min.) $SO_2$—$O_2$ | $N_2$—$H_2$ |
|---|---|---|---|
| 193 IL | 6 | 422 | 1131 |
| 248 IL | 10 | 250 | |
| 193 Si ARC | 15 | 90 | 450 |

While the present invention has been particularly shown and described with respect to preferred embodiments thereof, it will be understood by one skilled in the art that the foregoing and other changes in form and detail may be made without departing from the spirit and scope of the present invention. It is therefore intended that the present invention not be limited to the exact forms and details described and illustrated, but fall within the scope of the appended claims.

What is claimed is:

1. A composition suitable for formation of a spin-on antireflective layer comprising:
   a crosslinking component;
   a silicon polymer having a plurality of reactive sites distributed along the polymer for reaction with the crosslinking component, wherein said silicon polymer is a novolacsilane polymer comprising phenolic groups on the main chain and cluster silane groups on the side chains; and
   an acid generator.

2. The composition of claim 1, wherein the acid generator is a thermal acid generator.

3. The composition of claim 1, wherein the acid generator is a photoacid generator.

4. The composition of claim 1, wherein said reactive sites are selected from the group consisting of alcohols, amino groups, imino groups, carboxlic groups, vinyl ethers, expoxides and mixtures thereof.

5. The composition of claim 1, wherein said crosslinking compound comprises a glycoluril compound.

6. The composition of claim 1, wherein said reactive site is an alcohol group.

7. The composition of claim 1, wherein said novolacsilane polymer is a reaction product of a silane-substituted phenol and formalin.

8. A composition suitable for formation of a spin-on antireflective layer comprising:
   a crosslinking component; and
   a silicon polymer having a plurality of reactive sites distributed along the polymer for reaction with the crosslinking component, wherein said silicon polymer is a novolacsilane polymer comprising phenolic groups on the main chain and cluster silane groups on the side chains.

9. A composition suitable for formation of a spin-on antireflective layer comprising:
   a crosslinking component; and
   a silicon polymer having a plurality of reactive sites distributed along the polymer for reaction with the crosslinking component, wherein said silicon polymer is a novolacsilane polymer which is a reaction product of a silane-substituted phenol and formalin.

* * * * *